(12) United States Patent
Barber et al.

(10) Patent No.: US 11,899,077 B2
(45) Date of Patent: Feb. 13, 2024

(54) SYSTEM FOR TESTING ELECTRICAL CONNECTIONS BETWEEN COMPONENTS

(71) Applicant: Schweitzer Engineering Laboratories, Inc., Pullman, WA (US)

(72) Inventors: Brandon M. Barber, Genesee, ID (US); Mike Basford, Lewiston, ID (US); Michael R. Dowdy, Lewiston, ID (US); Martin D. Gardner, Lewiston, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 267 days.

(21) Appl. No.: 17/226,440

(22) Filed: Apr. 9, 2021

(65) Prior Publication Data

US 2022/0326315 A1 Oct. 13, 2022

(51) Int. Cl.
*G01R 31/67* (2020.01)
*G01R 31/71* (2020.01)

(52) U.S. Cl.
CPC ............. *G01R 31/67* (2020.01); *G01R 31/71* (2020.01)

(58) Field of Classification Search
None
See application file for complete search history.

(56) References Cited

U.S. PATENT DOCUMENTS

| D551,997 S | 10/2007 | Kesler |
| 7,460,590 B2 | 12/2008 | Lee |

FOREIGN PATENT DOCUMENTS

| CN | 109061365 A | * 12/2018 | ............. G01R 31/02 |
| CN | 208596180 U | * 3/2019 | |
| CN | 209879801 U | * 12/2019 | |

* cited by examiner

*Primary Examiner* — Patrick Assouad
*Assistant Examiner* — Haidong Zhang
(74) *Attorney, Agent, or Firm* — Fletcher Yoder, P.C.; Richard M. Edge

(57) ABSTRACT

A test system for an electrical system includes a slot array having a plurality of slots and a plurality of recesses formed therethrough, a plurality of mounts in which each mount of the plurality of mounts is positioned within a respective recess of the plurality of recesses to align with a respective slot of the plurality of slots, a connector port having a plurality of pins, and a plurality of conductors in which each conductor of the plurality of conductors extends from a respective pin of the plurality of pins to a respective mount of the plurality of mounts. Each mount of the plurality of mounts is configured to receive an additional conductor via a corresponding slot of the plurality of slots to electrically couple the additional conductor to a corresponding pin of the plurality of pins via a corresponding conductor of the plurality of conductors.

14 Claims, 9 Drawing Sheets

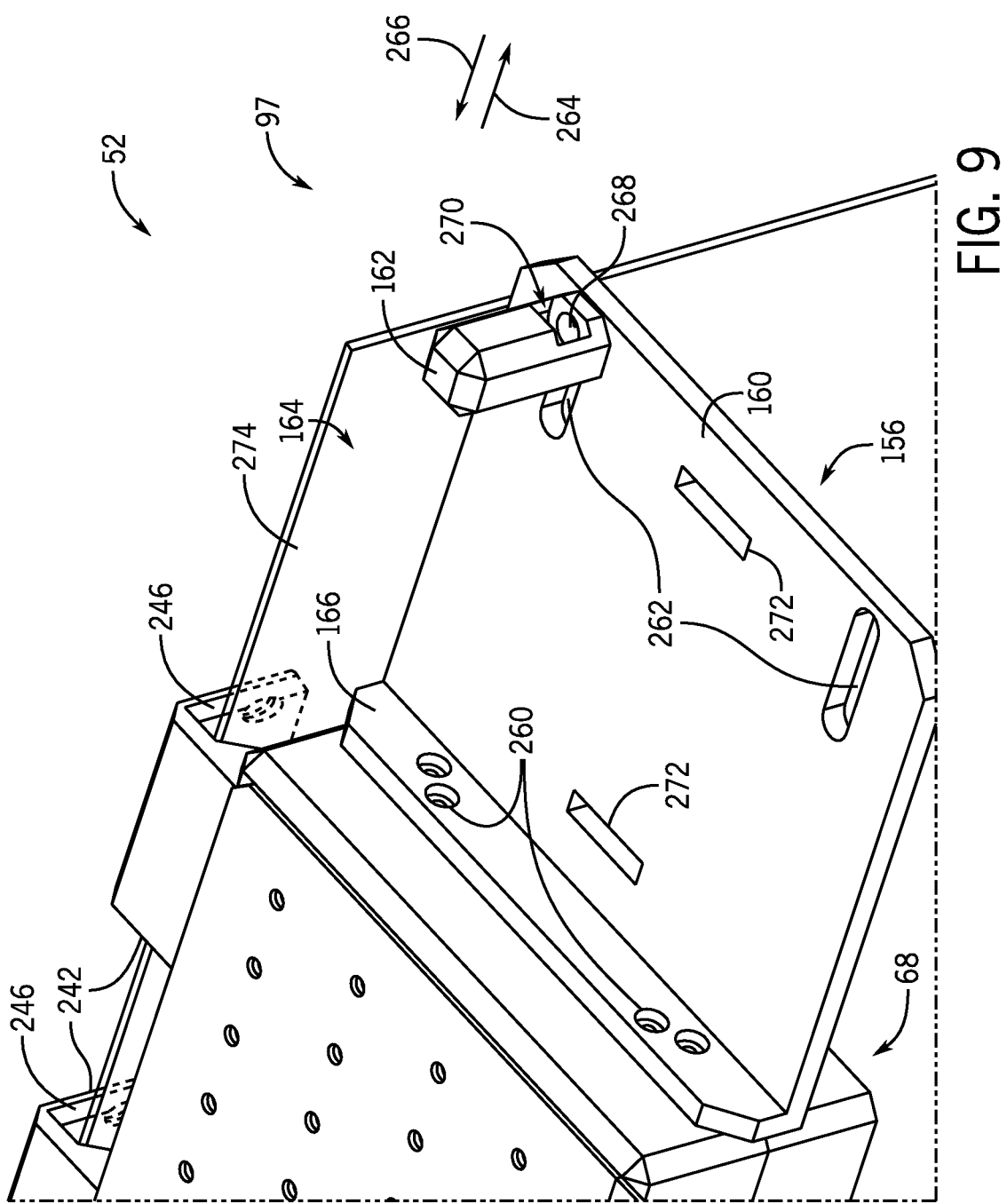

SYSTEM FOR TESTING ELECTRICAL CONNECTIONS BETWEEN COMPONENTS

BACKGROUND

This disclosure relates to a system that facilitates testing electrical connections and electrical coupling between various components.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of any kind.

An electrical system, such as a recloser, a motor control center, an electrical enclosure, may include various devices that are electrically coupled with one another and/or with devices external to the electrical system in order to perform a functionality for the electrical system. For example, an electrical connector, a wire, a terminal, and/or other suitable components may be used to electrically couple the devices to one another. In some circumstances, it may be desirable to test or inspect the electrical connections between such components, such as during installation, maintenance, and/or replacement of the devices. Testing the electrical connections may include, for example, inspecting electrical continuity to determine whether the components are electrically connected with one another to enable current flow, such as by using a testing device (e.g., a multimeter) that electrically couples to various points of the electrical system to determine whether the points are electrically connected with one another. However, it may be difficult to test the electrical connections for some electrical systems. For instance, the components may be arranged (e.g., positioned, oriented) in a manner that blocks or hinders the testing device from electrically coupling to (e.g., physically contacting) certain points of the electrical system, thereby impeding testing of the electrical connections between such points.

SUMMARY

Certain examples commensurate in scope with the originally claimed subject matter are discussed below. These examples are not intended to limit the scope of the disclosure. Indeed, the present disclosure may encompass a variety of forms that may be similar to or different from the examples set forth below.

In an embodiment, a test system for an electrical system includes a slot array having a plurality of slots and a plurality of recesses formed therethrough, a plurality of mounts in which each mount of the plurality of mounts is positioned within a respective recess of the plurality of recesses to align with a respective slot of the plurality of slots, a connector port having a plurality of pins, and a plurality of conductors in which each conductor of the plurality of conductors extends from a respective pin of the plurality of pins to a respective mount of the plurality of mounts. Each mount of the plurality of mounts is configured to receive an additional conductor via a corresponding slot of the plurality of slots to electrically couple the additional conductor to a corresponding pin of the plurality of pins via a corresponding conductor of the plurality of conductors.

In an embodiment, a test system for an electrical system includes a body having an enclosure defining an internal volume and a slot array with a plurality of slots and a plurality of recesses formed therethrough. Each slot of the plurality of slots is aligned with a corresponding recess of the plurality of recesses. The test system also includes a mount disposed within the internal volume and positioned within a recess of the plurality of recesses, a connector port having a plurality of pins, and a conductor extending within the internal volume. The conductor is electrically coupled to a pin of the plurality of pins and is inserted into the mount.

In an embodiment, a test system for an electrical system includes a body having a slot array that includes a plurality of slots and a plurality of recesses. The test system also includes a plurality of mounts in which a mount of the plurality of mounts is positioned within a respective recess of the plurality of recesses to align with a respective slot of the plurality of slots, a connector port having a plurality of pins, a plurality of conductors in which a conductor of the plurality of conductors is electrically coupled to a respective pin of the plurality of pins and extends into the mount of the plurality of mounts, and a device holder that includes a base configured to couple to the body. The device holder defines a space configured to receive a test device for testing an electrical connection of the electrical system.

BRIEF DESCRIPTION OF THE DRAWINGS

FIG. 9 is a partial side perspective view of an embodiment of a test system that may test electrical connections of an electrical system, in accordance with an aspect of the present disclosure.

DETAILED DESCRIPTION

Figure 1:
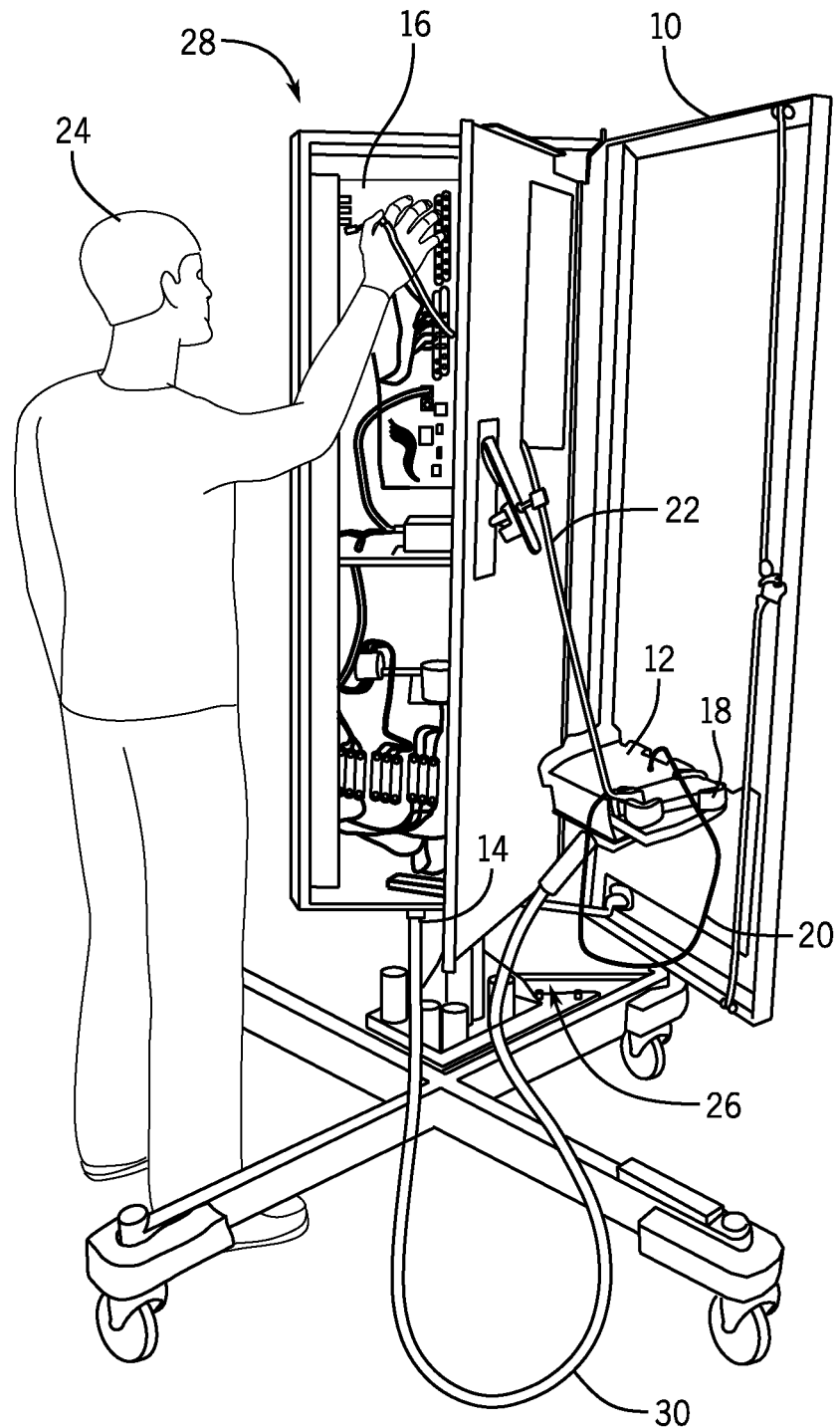
FIG. 1 is a perspective view of an embodiment of an electrical enclosure and a test system being used to test electrical connections of the electrical enclosure, in accordance with an aspect of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Certain examples commensurate in scope with the originally claimed subject matter are discussed below. These examples are not intended to limit the scope of the disclosure. Indeed, the present disclosure may encompass a variety of forms that may be similar to or different from the examples set forth below.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

The embodiments of the disclosure will be best understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the procedures of a method do not necessarily need to be executed in any specific order, or even sequentially, nor need the procedures be executed only once, unless otherwise specified. In some cases, well-known features, structures or operations are not shown or described in detail. Furthermore, the described features, structures, or operations may be combined in any suitable manner in one or more embodiments. The components of the embodiments as generally described and illustrated in the figures could be arranged and designed in a wide variety of different configurations.

Several aspects of the embodiments described may be implemented as software modules or components. As used herein, a software module or component may include any type of computer instruction or computer-executable code located within a memory device and/or transmitted as electronic signals over a system bus or wired or wireless network. A software module or component may, for instance, include physical or logical blocks of computer instructions, which may be organized as a routine, program, object, component, data structure, or the like, and which performs a task or implements a particular abstract data type.

In certain embodiments, a particular software module or component may include disparate instructions stored in different locations of a memory device, which together implement the described functionality of the module. Indeed, a module or component may include a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a tangible, non-transitory, computer-readable and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, compact disc read-only memories (CD-ROMs), digital versatile disc read-only memories (DVD-ROMs), read-only memories (ROMs), random access memories (RAMs), erasable programmable read-only memories (EPROMs), electrically erasable programmable read-only memories (EEPROMs), magnetic or optical cards, solid-state memory devices, or other types of machine-readable media suitable for storing electronic and/or processor executable instructions.

Embodiments of the present disclosure are directed to a system or a device that is used for testing electrical connections (e.g., electrical continuity) between components of an electrical system. The electrical system may include various devices and components, such as relays, switches, circuit breakers, motors, cables, wires, wiring harnesses, electrical connectors, and so forth, that may be electrically connected to one another (e.g., within an enclosure or housing of the electrical system). It may be desirable to test or inspect such electrical connections to determine whether a current flow is enabled between the devices and components to enable operation of the electrical system. That is, such testing may be used to determine whether the devices and components can communicate and operate with one another via the electrical connections.

Point-to-point testing may be used to test the electrical connections. For point-to-point testing, a test device (e.g., a multimeter) may be electrically coupled to a first point and a second point so as to determine the electrical connection between the first point and the second point. As an example, a multimeter may be used for point-to-point testing, and probes of the multimeter may be electrically coupled to the points (e.g., via physical contact) to determine whether there is a current flow between the points so as to test the electrical connection between the points. The first and second points may be a part of different components or devices. Thus, point-to-point testing may be used to determine the electrical connection between the different components or devices. Unfortunately, certain points may be arranged in a manner that impedes point-to-point testing. That is, the first point and the second point may be positioned at different locations to increase a difficulty for the test device to electrically couple to the points. For example, the first point may be at a first location (e.g., at a first section of an enclosure) that hinders accessibility to a second location (e.g., a second section of the enclosure) where the second point is positioned. As a result, testing the electrical connections may be inefficient or difficult. For instance, an excessive amount of time may be spent to operate the test device and/or multiple users may coordinate and operate the test device to test the electrical connection between certain points.

Accordingly, this disclosure describes a test system having a body with mounts that may each receive a conductor for electrically coupling different points of the electrical system to test electrical continuity between the points. For example, the mounts may be at an accessible location to enable the conductor to individually connect with any of a first set of points (e.g., a pin) of the electrical system more easily. The electrical system may also include a second set of points, and the test system may enable the conductor to electrically couple with a corresponding one of the second set of the electrical to determine the electrical continuity between the first set of points and the second set of points. For example, the test system may be easily moved to enable the conductor to electrically couple to one of the second set of points while remaining electrically coupled to one of the first set of points via the body of the test system. Thus, the test system may enable the conductor to electrically couple to both the first set of points and the second set of points more easily to determine the electrical connection between the points. Although the present disclosure primarily discusses usage of the test system with respect to components of an electrical system, the test system may be used to test electrical connections between components of any suitable system.

With the preceding in mind, FIG. 1 is a perspective view of an embodiment of an electrical enclosure 10 and a test system 12. The test system 12 may be used for testing an electrical connection or continuity between various parts of the electrical enclosure 10. For example, the test system 12 may be used to test the electrical connections between a first component or device 14 (e.g., having a connector with pins) of the electrical enclosure 10 and a second component or device 16 (e.g., having electrical interfaces). A test tool 18 (e.g., a multimeter) is used to electrically couple with the first component 14 and with the second component 16 to test the electrical connections between the components 14, 16. For example, the test tool 18 may include a first probe 20 that may be used to electrically couple to the first component 14, and the test tool 18 may include a second probe 22 that may be used to electrically couple to the second component 16.

In conventional approaches, the first probe 20 may mechanically engage with (e.g., directly contact) the first component 14 to electrically couple to the first component 14, and the second probe 22 may mechanically engage with (e.g., directly contact) the second component 16 to electrically couple to the second component 16. However, the first component 14 and/or the second component 16 may not be easily accessible to a user 24 for electrically coupling with the test tool 18. For example, in the illustrated embodiment, the first component 14 is positioned at an underside 26 of the electrical enclosure 10, and the second component 16 is positioned near a top 28 of the electrical enclosure 10. It may be difficult to utilize the test tool 18 to electrically couple to the components 14, 16 in such an arrangement. For instance, it may be difficult to maintain mechanical engagement between the first probe 20 and the first component 14 while adjusting the second probe 22 to mechanically engage with the second component 16.

The test system 12 may facilitate respective electrical coupling between the probes 20, 22 of the test tool 18 with the components 14, 16. As an example, a cable 30 may mechanically engage with the first component 14 to electrically couple to the first component 14. The cable 30 may also mechanically engage with the test system 12, such as to a port of the test system 12. As further described herein, the test system 12 may include mounts that may each receive the first probe 20 and enable the first probe 20 to be electrically coupled to the port upon insertion into one of the mounts. Thus, the mounts may enable the first probe 20 to electrically couple to the first component 14 via the port and the cable 30. In some embodiments, each mount may enable the first probe 20 to electrically couple to a different part (e.g., point, section, portion) of the first component 14, thereby enabling the user 24 to selectively test electrical connections between different parts of the components 14, 16.

The mounts may be easily accessible to the first probe 20 of the test tool 18. For example, the test tool 18 may be secured onto the test system 12 at a position that facilities insertion of the first probe 20 into one of the mounts. In addition, the test system 12 may be arranged to electrically couple to the first component 14 (e.g., via the cable 30). In the illustrated embodiment, the test system 12 is attached onto the electrical enclosure 10 (e.g., a panel of the electrical enclosure 10). Additionally or alternatively, the test system 12 may be portable and may be positioned in any desirable manner, such as by being held by the user 24. As an example, the user 24 may position and/or orient the test system 12 to enable the second probe 22 to be electrically coupled to the second component 16 more easily while maintaining the electrical coupling between the first component 14 and the first probe 20 (e.g., via the mounts of the test system 12). In this manner, the test system 12 enables the user 24 to test the electrical connections between the first component 14 and the second component 16 more efficiently and/or easily.

Figure 2:
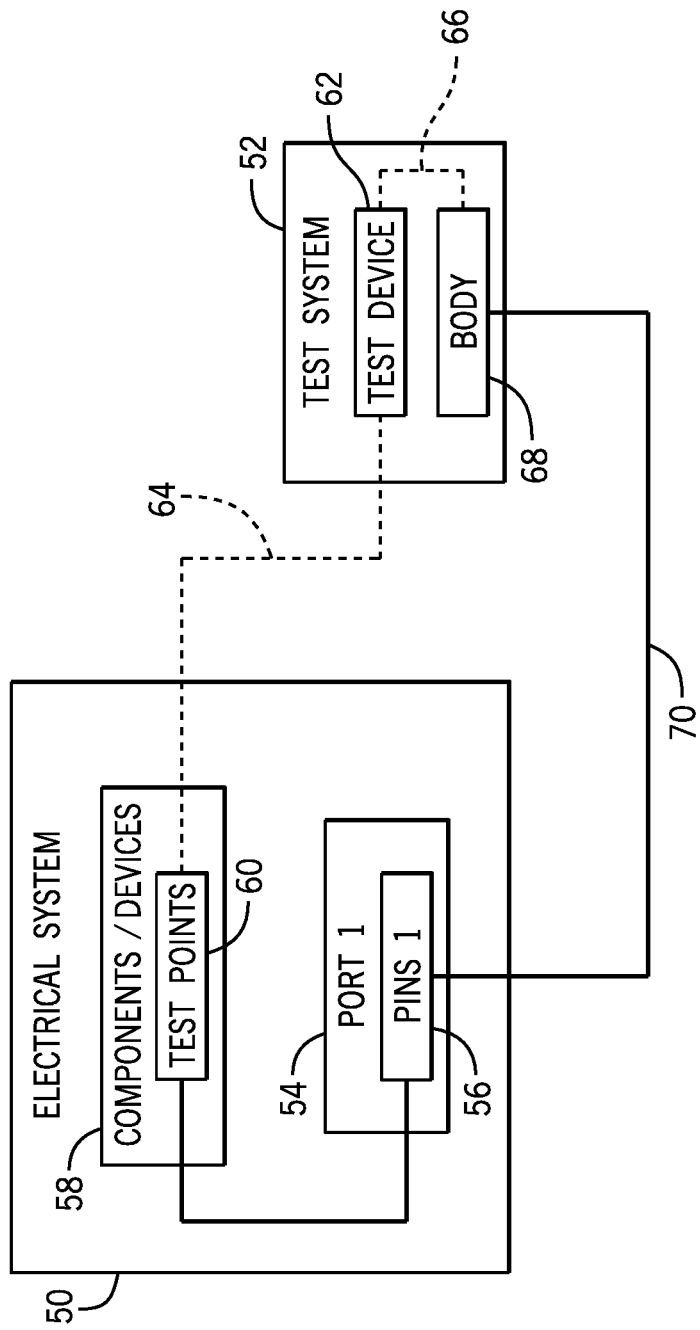
FIG. 2 is a schematic diagram of an embodiment of an electrical system and a test system that may test electrical connections of the electrical system, in accordance with an aspect of the present disclosure.

FIG. 2 is a schematic diagram of an embodiment of an electrical system 50 (e.g., the electrical enclosure 10) and a test system 52 (e.g., the test system 12) used for testing an electrical connection between various points of the electrical system 50. For example, the electrical system 50 may include a first connector port 54 (e.g., a male connector port) that includes first pins 56 (e.g., the first component 14). The first connector port 54 may, for instance, be a part of a 32-pin military connector, a 42-pin military connector, or any other suitable connector that may include the first pins 56. The electrical system 50 may also include various components and/or devices 58 (e.g., the second component 16) that are to be electrically coupled to the first pins 56. For instance, each of the first pins 56 may be electrically coupled to one of the components/devices 58, and the first pins 56 may be electrically coupled (e.g., via a cable) to another device or component, such as a power source, to electrically couple the other device or component to the components/devices 58 of the electrical system 50.

It may be desirable to test or inspect the electrical connection between the first pins 56 and the components/devices 58. For example, each of the components/devices 58 may include respective test points 60 (e.g., conductive portions, semi conductive portions), and testing may be performed to determine whether the test points 60 are electrically coupled to the first pins 56 to verify that the components/devices 58 are electrically coupled to the first pins 56. That is, an electrical continuity between the first pins 56 and the test points 60 may be determined to verify that current flow is enabled between the first pins 56 and the components/devices 58.

As mentioned above, point-to-point testing may be used to determine electrical connections. The test system 52 may use a test device 62 (e.g., the test tool 18) that may utilize point-to-point testing by electrically coupling to any of the first pins 56 and to any of the test points 60. In some embodiments, the test device 62 may be separately manufactured and/or purchased from the test system 52. In additional or alternative embodiments, the test device 62 may be integral to (e.g., manufactured with) the test system 52. The test device 62 may include a first conductor 64 (e.g., a first probe, a first test lead, a first clip) that may electrically couple to one of the test points 60 and a second conductor 66 (e.g., a second probe, a second test lead, a second clip) that may electrically couple to one of the first pins 56. The first conductor 64 and the second conductor 66 may be selectively and adjustably engaged with (e.g., secured to, in contact with) the test points 60 and the first pins 56, respectively. That is, each of the first conductor 64 and the second conductor 66 may be moved to electrically couple to any of the test points 60 and the first pins 56, respectively. For instance, the conductors 64, 66 may be flexible to enable a user to move the conductors 64, 66 between various test points 60 and/or first pins 56 to different electrical connections.

While the first conductor 64 and the second conductor 66 are electrically coupled to one of the test points 60 and one of the first pins 56, respectively, the test device 62 may indicate whether the test point 60 is electrically coupled to the first pin 56. For instance, the test device 62 may include a display and present an output (e.g., an image data, an audio output) indicative of whether the test points 60 and the first pins 56 are electrically coupled to one another. As an example, the test device 62 may transmit a current through one of the conductors 64, 66 and determine if the other of the conductors 64, 66 receives the current flow. When the first conductor 64 and the second conductor 66 are electrically coupled to one of the test points 60 and one of the first pins 56, respectively, the current may flow from one of the conductors 64, 66 to the electrical system 50 (e.g., to the test point 60, to the first pin 56). While the test point 60 and the first pin 56 are electrically coupled to one another, the current may flow between the test point 60 and the first pin 56 for receipt by the other of the conductors 64, 66. While the test point 60 and the first pin 56 are not electrically coupled to one another, the current may not flow between the test point 60 and the first pin 56, and the other of the conductors 64, 66 may not receive the current. The test device 62 may therefore indicate receipt of the current flow to indicate that the test point 60 and the first pin 56 are electrically coupled to one another, and the test device 62 may not indicate receipt of the current flow to indicate that the test point 60 and the first pin 56 are not electrically coupled to one another. A user may therefore utilize the conductors 64, 66 of the test device 62 to determine whether respective test points 60 are electrically coupled to a corresponding first pins 56.

The test system 52 may facilitate electrical coupling between the test device 62 and the first pins 56 and the test points 60. That is, the test system 52 may facilitate electrical coupling between the first conductor 64 and the test points 60 and/or between the second conductor 66 and the first pins 56. For example, the test system 52 may include a body 68 that may facilitate electrical coupling between the second conductor 66 and the first pins 56. For instance, a first physical connector 70 (e.g., a conductor, a semiconductor), such as a cable (e.g., the cable 30) and/or a wire, may be electrically coupled to the first pins 56 and may extend between the body 68 and the first pins 56. The second conductor 66 may electrically couple to the first physical connector 70 via the body 68 in order to electrically couple to one of the first pins 56. In other words, the test device 62 may electrically couple to the first pins 56 via the first physical connector 70 instead of via direct physical contact between the second conductor 66 and the first pins 56.

The body 68 may be in a more accessible location, position, and/or orientation with respect to the second conductor 66 as compared to the first pins 56. As an example, the body 68 may be positioned adjacent to the test device 62 to enable the second conductor 66 to extend more easily to the body 68 to electrically couple to the first physical connector 70. Additionally, the test system 52 may be mobile and/or portable to enable the test system 52 to be moved more easily (e.g., relative to the electrical system 50). As such, the test system 52 may be positioned to enable the first conductor 64 to extend to the test points 60, thereby facilitating electrical coupling between the test points 60 and the test device 62, while the second conductor 66 remains electrically coupled to the first physical connector 70. In this manner, the test system 52 may enable the test device 62 to electrically couple to the first pins 56 and the test points 60 more easily to test the electrical connection between the first pins 56 and the test points 60.

Figure 3:
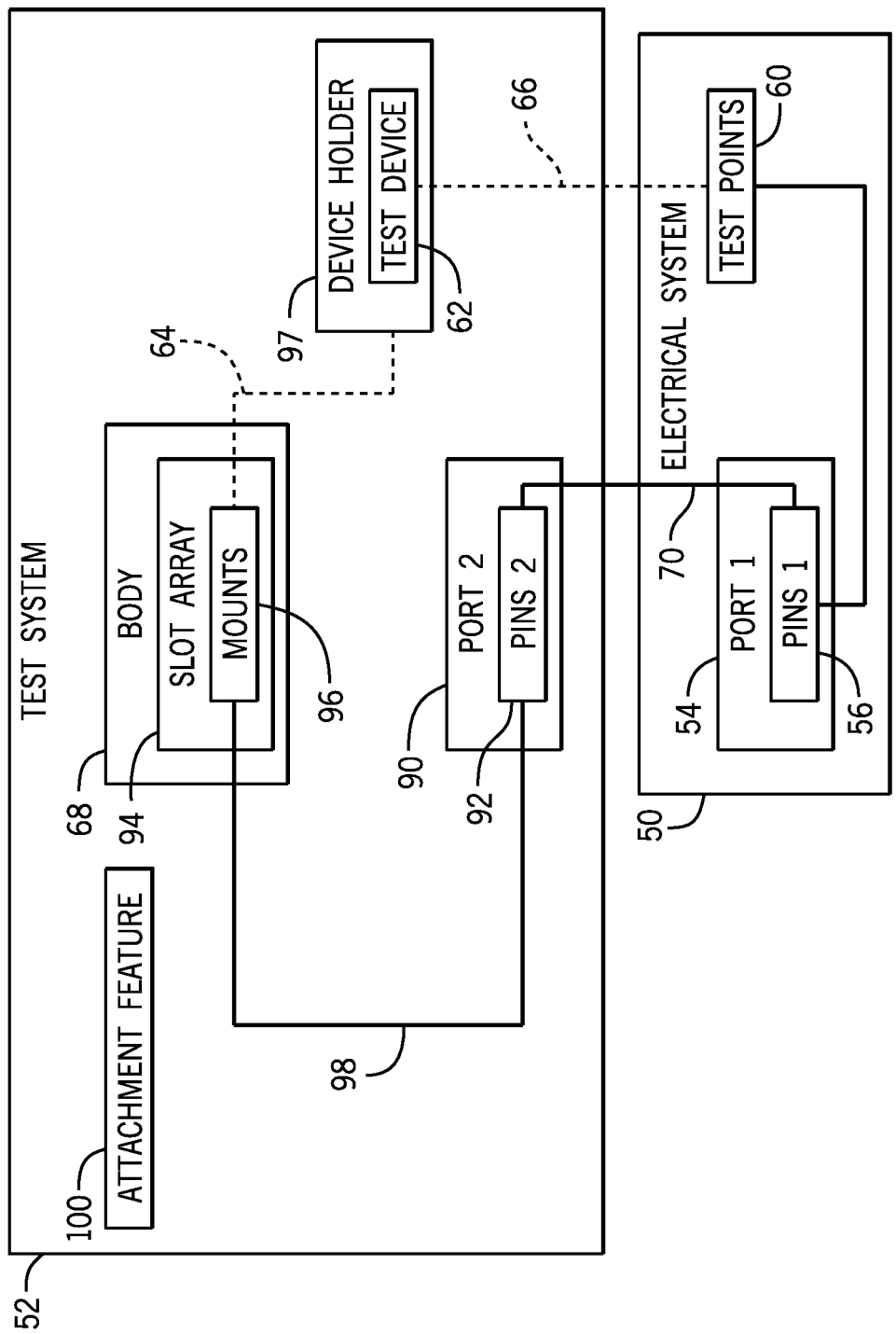
FIG. 3 is a schematic diagram of an embodiment of a test system that may test electrical connections of an electrical system, in accordance with an aspect of the present disclosure.

FIG. 3 is a schematic diagram further illustrating the test system 52. In the illustrated embodiment, the test system 52 includes a second connector port 90 (e.g., a male connector port) that may include second pins 92. The first physical connector 70 may attach to the first connector port 54 and to the second connector port 90 in order to electrically couple the first pins 56 to the second pins 92. For instance, the first physical connector 70 may electrically couple to each of the first pins 56 upon securement to the first connector port 54 and to each of the second pins 92 upon securement to the second connector port 90. Furthermore, the body 68 of the test system 52 may include a slot array 94, which may be a physical panel having slots or openings formed therethrough. Respective mounts 96 (e.g., alignment blocks) may be positioned within the slots of the slot array 94. Respective second physical connectors 98 (e.g., conductors, semiconductors), such as jumper wires, may be electrically coupled to one of the second pins 92 of the second connector port 90 and may extend from the second pins 92 to one of the mounts 96. For example, a respective wire connector (e.g., a barrel contact) may be secured (e.g., crimped, soldered) onto each second physical connector 98, and each wire connector may be and inserted into a corresponding one of the mounts 96. The mounts 96 may retain the wire connector to secure the respective second physical connectors 98 within the corresponding mounts 96.

The first conductor 64 may be selectively and adjustably secured to any of the mounts 96 in order to electrically couple to a corresponding second pin 92. By way of example, the first conductor 64 may be inserted into one of the mounts 96 via the openings of the slot array 94 to electrically couple to the second physical connector 98 retained in the mount 96 and the second pin 92 electrically coupled to the second physical connector 98. Indeed, the first conductor 64 may be easily inserted into and removed from each of the mounts 96 to enable the test device 62 to adjust electrical coupling between the mounts 96 and corresponding second pins 92 more easily.

The test system 52 may include a device holder 97 that may be used to secure the test device 62 onto the test system 52. By way of example, the device holder 97 may retain the test device 62 in a desirable position and/or orientation relative to (e.g., adjacent to) the body 68 to enable the second conductor 64 to be easily coupled to any of the mounts 96. As further described herein, the device holder 97 may include a backing that may be adjustable to secure a test device 62 of any suitable size and/or shape in the test system 52. For instance, the backing of the device holder 97 may be adjust a size of a space defined by the device holder 97, such as by increasing the size of the space to enable the test device 62 to be positioned within the space and by reducing the size of the space to secure the test device 62 within the space. Indeed, the device holder 97 may block undesirable relative movement between the test device 62 and the test system 52 to secure the test device 62 to the test system 52. For instance, the test system 52 and the test device 62 may be moved together to facilitate electrical coupling (e.g., physical contact) between the second conductor 66 and one of the test points 60 without hindering the coupling between the first conductor 64 and one of the first pins 56.

The test system 52 may further include an attachment feature 100 that may enable the test system 52 to be positioned more easily. In some embodiments, the attachment feature 100 may include a handle, a grip, a knob, and the like, to enable a user to grasp the test system 52 and to move the test system 52 in a desirable manner. In additional or alternative embodiments, the attachment feature 100 may include a clip, a hook, a mount, and the like, to enable the test system 52 to be attached onto a different object, such as an enclosure (e.g., of the electrical system 50), a table, a corresponding mount, and so forth. The attachment feature 100 may therefore facilitate desirable positioning and/or securement of the test system 52 without the user having to hold the test system 52.

Figure 4:
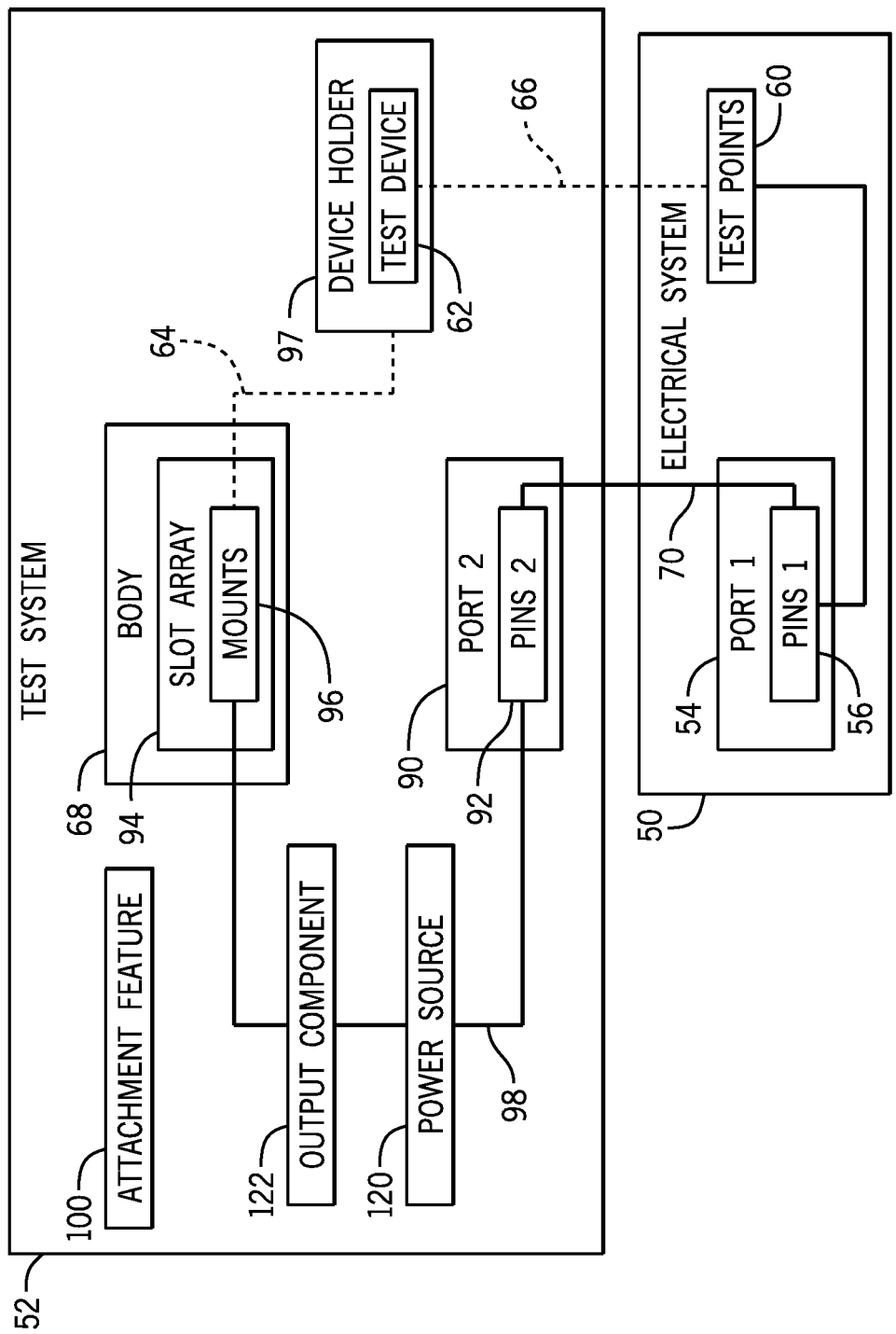
FIG. 4 is a schematic diagram of an embodiment of a test system that may test electrical connections of an electrical system, in accordance with an aspect of the present disclosure.

FIG. 4 is a schematic diagram of an embodiment of the test system 52. The illustrated test system 52 includes a power source 120 (e.g., a battery, a capacitor, a photovoltaic energy source, an external power source) that is electrically coupled to the second physical connectors 98. Thus, the power source 120 may be electrically coupled to the second pins 92. The test system 52 may further include an output component 122 that is electrically coupled to the power source 120 (e.g., via the second physical connectors 98). The power source 120 may supply energy (e.g., an electrical current) that may energize the output component 122 upon completion of an electrical circuit between one of the second pins 92 and a corresponding one of the test points 60. As an example, the test device 62 may electrically couple to one of the second pins 92 (e.g., via the mounts 96) and a corresponding one of the test points 60. The electrical circuit may be completed by the electrical connection between the second pin 92 and the test point 60 via the first pins 56, the first physical connector 70, and the second physical connectors 98, as well as the electrical connection between the second pin 92 and the test point 60 via the conductors 64, 66. In this way, the electrical connection between the first pins 56 and the test point 60 may be determined based on whether the output component 122 is energized when the conductors 64, 66 are electrically coupled to the second pin 92 and the test point 60, respectively.

By way of example, for a first pin 56 that is electrically connected to a test point 60 within the electrical system 50, electrically coupling the first conductor 64 to a corresponding second pin 92 and the second conductor 66 to a corresponding test point 60 may complete the electrical circuit that enables the power source 120 to energize the output component 122. However, for a first pin 56 that is not electrically connected to a test point 60 within the electrical system 50, electrically coupling the first conductor 64 to a corresponding second pin 92 and the second conductor 66 to a corresponding test point 60 does not complete the electrical circuit, and the output component 122 therefore is not energized. As such, energization of the output component 122 may indicate that a first pin 56 is electrically connected to a test point 60, and lack of energization of the output component 122 may indicate that a first pin 56 is not electrically connected to a test point 60. In some embodiments, the output component 122 may output a visual indication while energized. For example, the output component 122 may include a light emitting diode (e.g., attached to the body 68) that emits a light while energized. In additional or alternative embodiments, the output component 122 may output an audio indication (e.g., a sound) while energized, upon power-up, or upon power-down. In further embodiments, the output component 122 may output any suitable feedback (e.g., haptic feedback) while energized to provide an indication of the electrical connection between the first pins 56 and the test points 60.

In such embodiments, the test device 62 may include any suitable device or component that enables current flow between the conductors 64, 66 to complete the electrical circuit between one of the second pins 92 and a corresponding test point 60. As an example, the test device 62 may include a single conductor (e.g., a wire), and the conductors 64, 66 may be opposite portions (e.g., ends) of the single conductor. As another example, the test device 62 may include the conductors 64, 66 as separate components, and the test device 62 may include an additional component that electrically couples the conductors 64, 66 to one another to enable current flow between the conductors 64, 66 to complete the electrical circuit.

Figure 5:
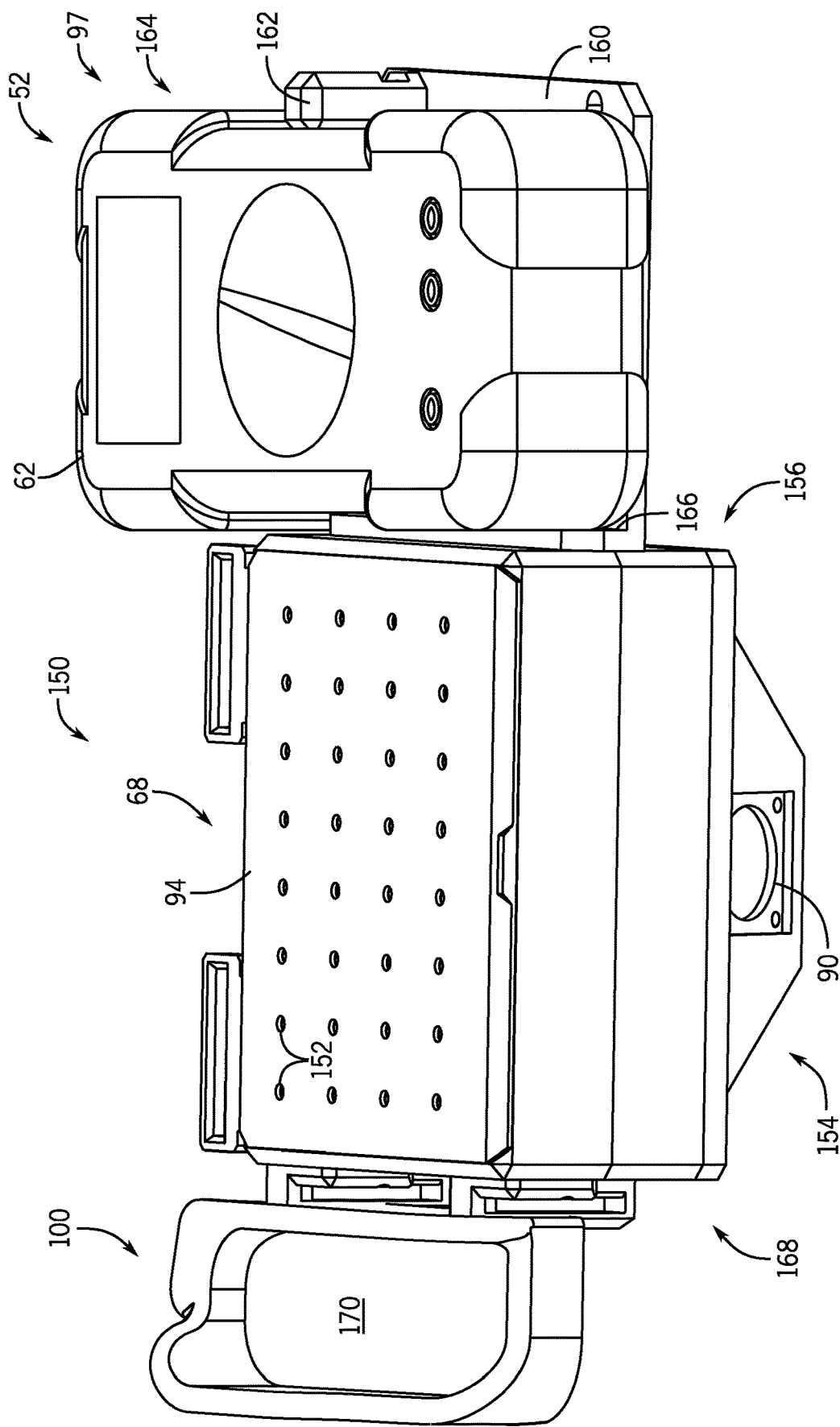
FIG. 5 is a front perspective view of an embodiment of a test system that may test electrical connections of an electrical system, in accordance with an aspect of the present disclosure.

FIG. 5 is a front perspective view of an embodiment of the test system 52. In the illustrated embodiment, the slot array 94 may be disposed at a first side 150 (e.g., a top) of the test system 50. The slot array 94 may include multiple slots or openings 152 that each provide access to a respective mount 96 (not shown). For example, the body 68 may include an enclosure that defines an internal volume or cavity, and each mount 96 may be positioned within the internal volume and aligned with one of the slots 152. Thus, the first conductor 64 may be inserted into any of mounts 96 via a corresponding slot 152. In certain embodiments, the slot array 94 may be separately manufacture from a remainder of the body 68. For example, the slot array 94 may be removably coupled to the remainder of the body 68 to enable easier decoupling of the slot array 94 from the body 68, such as to expose the internal volume (e.g., the mounts 96, the second physical connectors 98) of the body 68.

In addition, the second connector port 90 may be disposed at a second side 154 (e.g., a bottom), opposite the first side 150, of the test system 50. As such, the second connector port 90 may not interfere with exposure of slots 152, thereby enabling access to each of the mounts 96 by the first conductor 64. The second pins 92 (not shown) may be extend within the internal volume of the body 68, and the second physical connectors 98 may be routed through the internal volume from the respective second pins 92 to a corresponding mount 96. Although the illustrated slot array 94 includes thirty-two slots 152, the slot array 94 in additional or alternative test devices 62 may include any suitable number of slots 152, such as the same number of slots 152 as the number of second pins 92.

The slots 152 may be sized to enable the first conductor 64 of the test device 62 to be easily inserted and attached to a corresponding mount 96. The mount 96 may retain the first conductor 64 until a sufficient force is applied to remove the first conductor 64 from the mount 96 and out of the slot 152. In this way, the first conductor 64 may remain electrically coupled to a corresponding second physical connector 98 and second pin 92 via the mount 96 while the second conductor 66 is adjusted to electrically couple to one of the test points 60. In certain embodiments, the slot array 94 may include a respective label associated with each slot 152. For each slot 152, the corresponding label may indicate the particular second pin 92 that is inserted into the mount 96 of the slot 152. In other words, the labels may map the second pins 92 to a corresponding slot 152 used for electrically coupling the first conductor 64 to each second pin 92. For instance, each of the second pins 92 may be associated with a different identifier (e.g., a number, a letter, a textual identifier, a symbol), and a label may use the same identifier associated with a corresponding second pin 92 to indicate a slot 152 having a mount 96 in which the corresponding second pin 92 is inserted. Thus, the labels help the user identify which particular second pin 92 is electrically coupled to the first conductor 94 when inserting the first conductor 94 into one of the slots 152. In certain embodiments, the labels may be integrally formed with the body 68, such as via etching onto the body 68 and/or via extrusion of the body 68. In additional or alternative embodiments, the labels may be separately manufactured from the body 68 and may be coupled to the body 68, such as via an adhesive.

The device holder 97 may be disposed at a third side 156 of the body 68. The illustrated device holder 97 includes a base 160 (e.g., a support plate) that may support the test device 62. The device holder 97 may also include a backing 162 (e.g., a post) that defines a space 164 in which the test device 62 may be positioned. The backing 162 may be movable or adjustable to change a size of the space 164. For instance, the backing 162 may be moved relative to the base 160 to increase the size of the space 164 to facilitate placement of the test device 62 within the space 164. Further, the backing 162 may be moved relative to the base 160 to reduce the size of the space 164 to secure the test device 62 within the space 164, such as by abutting against the test device 62 to bias the test device 62 against a flange 166 of the device holder 97, thereby restricting relative movement between the test device 62 and the base 160 to secure the test device 62 to the test system 52. Indeed, the backing 162 may be moved to enable any suitably sized or shaped test device 62 to be positioned within the space 164, thereby enabling different embodiments of the test device 62 to be used for the test system 52.

The attachment feature 100 may be disposed at a fourth side 168, opposite the third side 156, of the body 68. As such, the attachment feature 100 may not affect access to the space 164 to enable the test device 62 to be secured to the device holder 97. The illustrated attachment feature 100 includes a handle forming a loop and defining an aperture 170 to help a user grasp or hold the test system 52. For instance, the user may insert one of their hands into the aperture 170 to hold the test system 52. The user may then use another hand to operate the test device 62, such as to secure the test device 62 within the space 164, to move and insert the first conductor 64 into one of the slots 152 to electrically couple to a corresponding second pin 92, and/or to move the second conductor 66 and electrically couple the second conductor 66 to one of the test points 60 of the electrical system 50. In this way, the test system 52 may enable a single user to utilize the test device 62 to test the electrical connections of the electrical system 50. Although the illustrated attachment feature 100 includes a loop, an additional or alternative attachment feature 100 may include any suitable shape (e.g., a hook, a rod) to enable a user to grasp the test device 62. A further attachment feature 100 may be shaped to enable the test device 62 to mount and secure to another object. Further still, the test device 62 may include multiple attachment features 100, such as different attachment features 100 that facilitate both user possession and object mounting. The attachment feature 100 may also be positioned in any manner relative to the body 68. For instance, the attachment feature 100 may be positioned at the third side 156 (e.g., and the device holder 97 may be positioned at the fourth side 168) of the body 68.

As further described herein, in certain embodiments, the body 68, the device holder 97, and/or the attachment feature 100 may be separately manufactured (e.g., via additive manufacturing, via machining) and individually coupled to one another. In such embodiments, the test system 52 may be modular, and the body 68, the device holder 97, and/or the attachment feature 100 may be easily decoupled from one another, such as to replace different parts of the test system 52. In additional or alternative embodiments, the body 68, the device holder 97, and/or the attachment feature 100 may be integrally manufactured (e.g., via additive manufacturing, via machining). In such an embodiment, the body 68, the device holder 97, and/or the attachment feature 100 may not be easily decoupled from one another.

Figure 6:
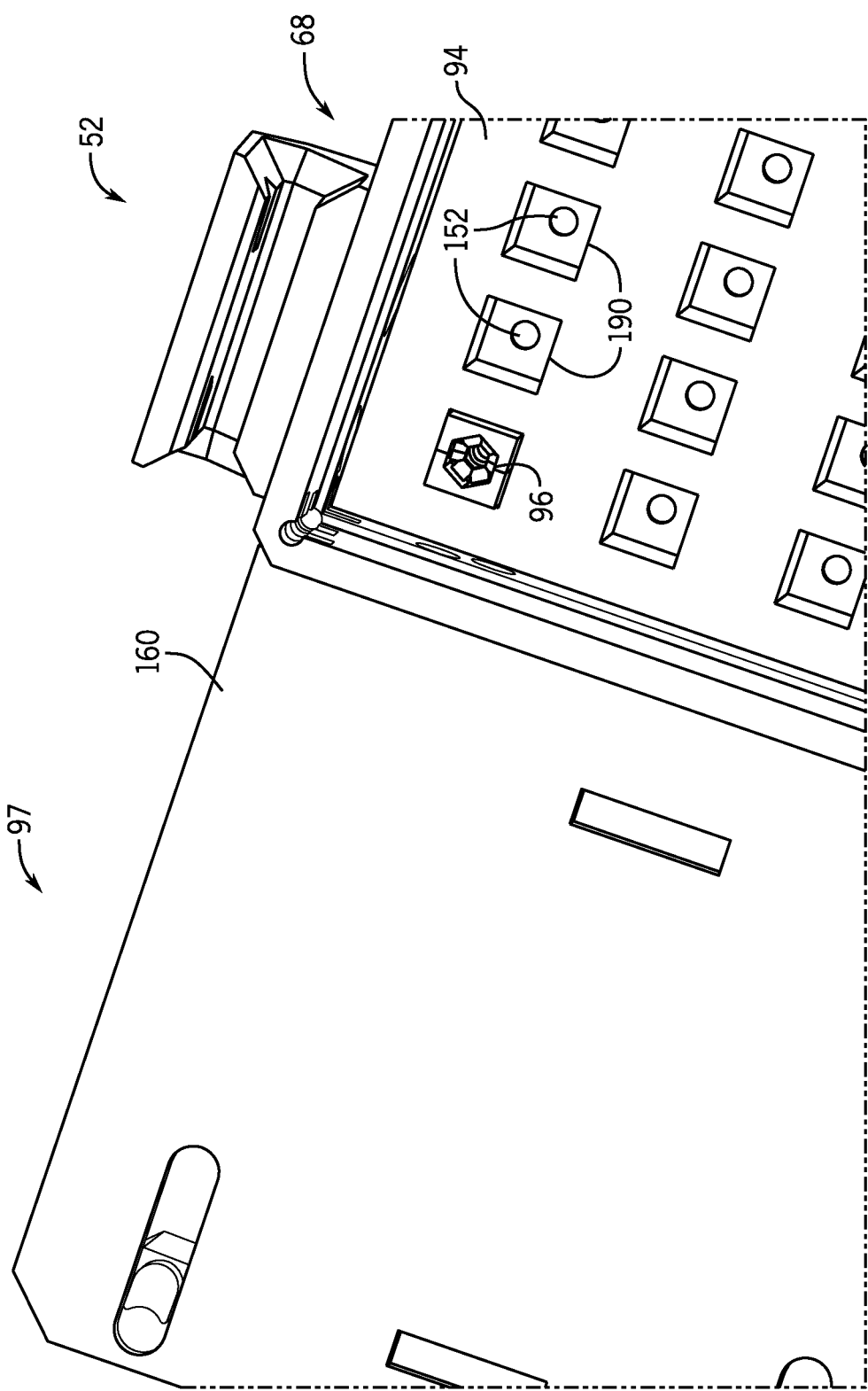
FIG. 6 is a partial bottom view of an embodiment of a test system that may test electrical connections of an electrical system, in accordance with an aspect of the present disclosure.

FIG. 6 is a partial bottom view of an embodiment of the body 68 of the test system 52. Certain components (e.g., the second connector port 90) of the test system 52 are not shown to illustrate the underside of the slot array 94. The slot array 94 includes recesses 190 that are aligned with corresponding slots 152. A respective mount 96 may be inserted within the recesses 190 to align with a corresponding slot 152. Each recess 190 may retain the mount 96 while the first conductor 64 is being inserted into the mount 96. For example, the recesses 190 may use an interference fit to retain the mount 96, and/or another component (e.g., a fastener, an adhesive) may be used to retain the mounts 96 within the respective recesses 190. Indeed, the recesses 190 may be shaped and sized to accommodate insertion and securement of the mounts 96.

Figure 7:
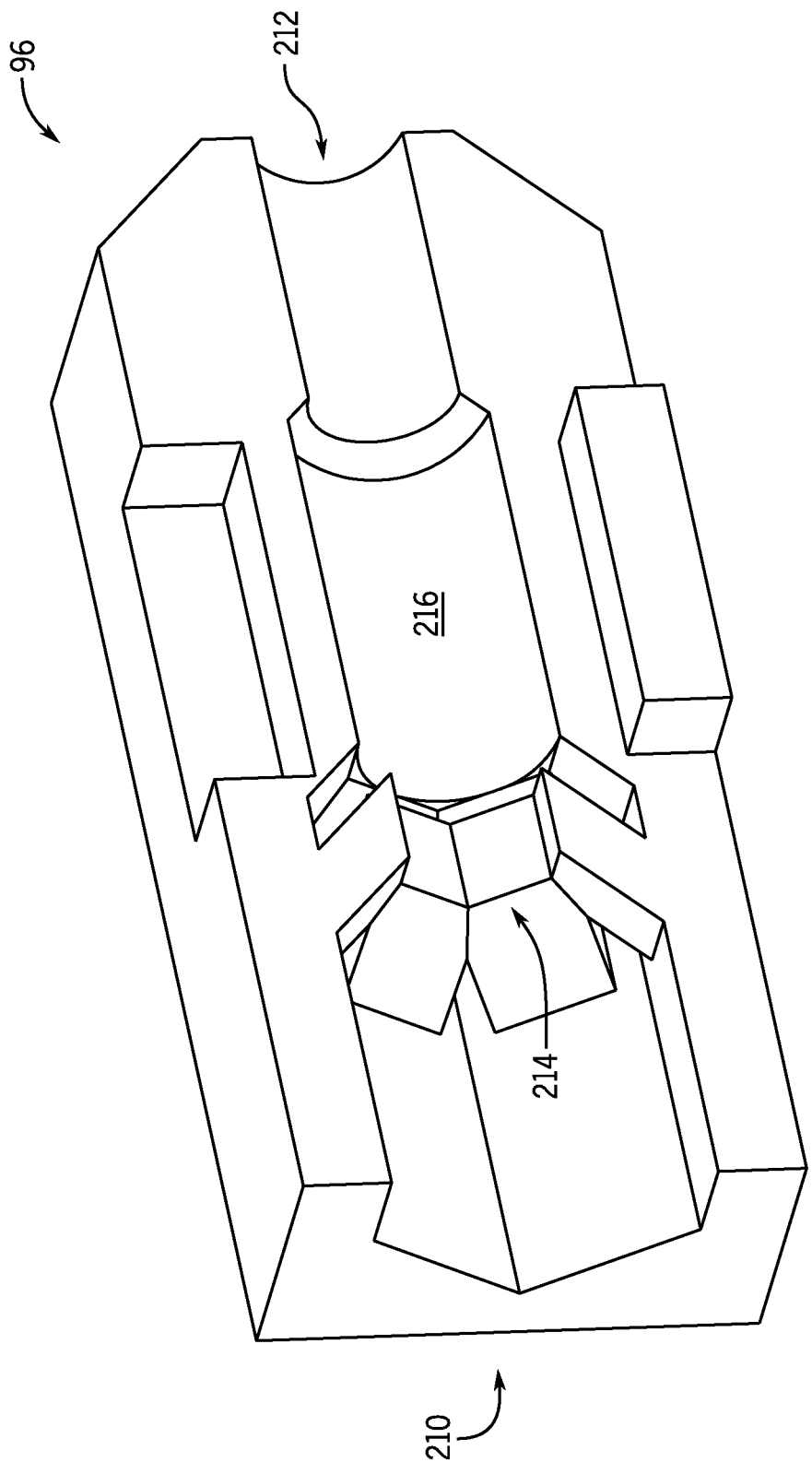
FIG. 7 is a side perspective view of an embodiment of a component incorporated in a test system that may test electrical connections of an electrical system, in accordance with an aspect of the present disclosure.

FIG. 7 is a side perspective view of an embodiment of the mount 96 that may be secured within one of the recesses 190. In some embodiments, the mount 96 may include two similar (e.g., identical, symmetrical, mirrored) components that engage with one another upon insertion into a corresponding recess 190, and FIG. 7 illustrates one of the components. The illustrated mount 96 includes a first receptacle 210, which may be configured to receive one of the second physical connectors 98 (e.g., a wire connector secured onto one of the second physical connectors 98). The illustrated mount 96 also includes a second receptacle 212, which may be aligned with a corresponding slot 152 and may receive the first conductor 64 inserted into the slot 152. Thus, the first receptacle 210 and the second receptacle 212 may be formed at opposite sides of the mount 96. The mount 96 may also include a throat 214 and a passage 216 that cooperatively span between the first receptacle 210 and the second receptacle 212. The throat 214 and the passage 216 may enable the first conductor 64 to extend from the second receptacle 212 toward the first receptacle 210, thereby electrically coupling the first conductor 64 to the corresponding second physical connector 98 (e.g., and to the corresponding second pin 92). For instance, the throat 214 may be adjacent to the first receptacle 210, and the passage 216 may be adjacent to the second receptacle 212.

The throat 214 and the passage 216 may shaped to block unexpected electrical flow (e.g., energetics) out of the slot 152. For example, the cross-sectional area of the throat 214 may be smaller than the cross-sectional area of the first receptacle 210 and the cross-sectional area of the passage 216. As such, the first receptacle 210, the throat 214, and the passage 216 may form a Venturi nozzle that may block the unexpected electrical flow from the first receptacle 210 toward the second receptacle 212. For instance, the mount 96 may contain the unexpected electrical flow within the internal volume of the body 68 and block exposure of the electrical flow to the user.

Figure 8:
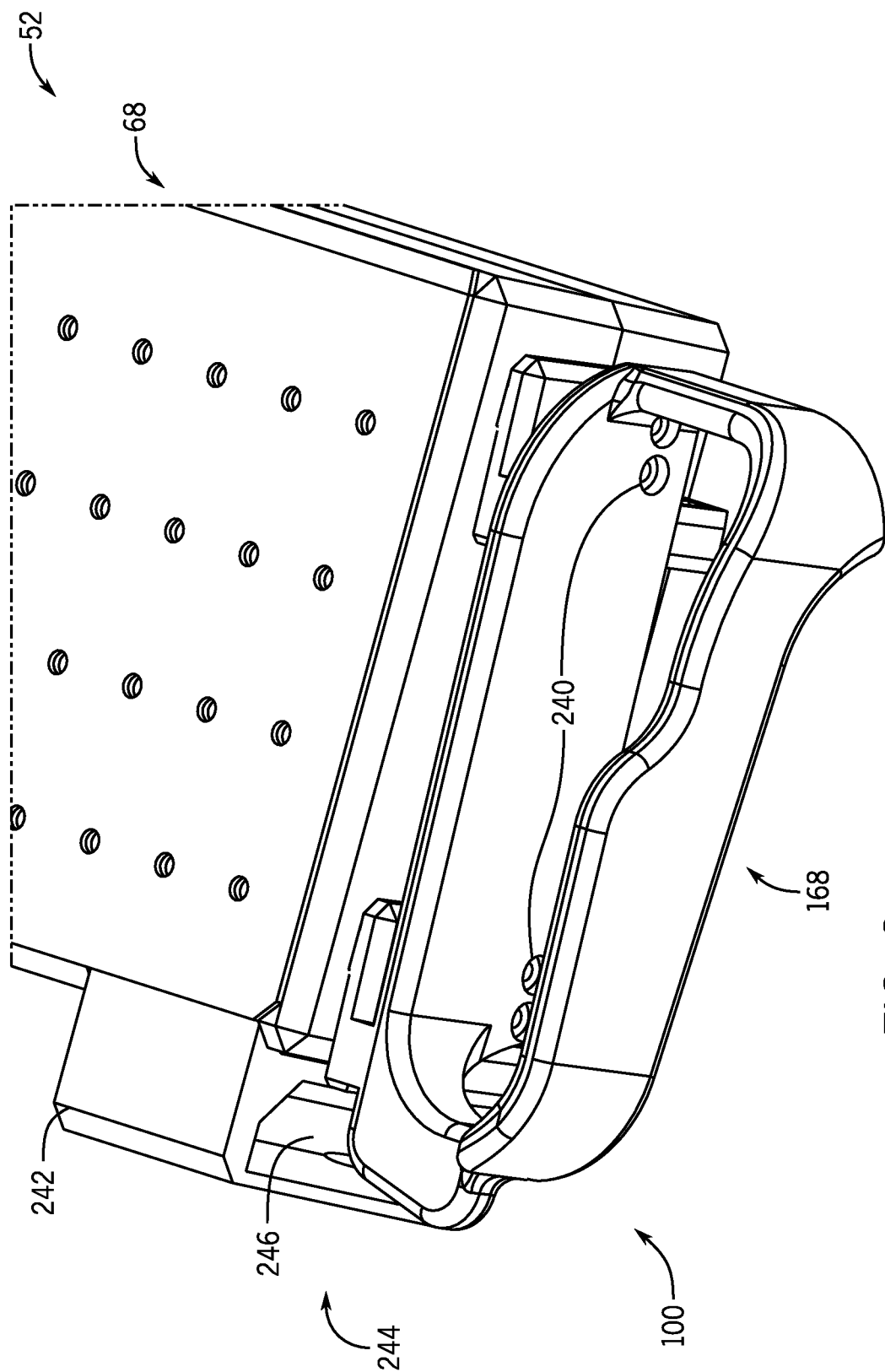
FIG. 8 is a partial side perspective view of an embodiment of a test system that may test electrical connections of an electrical system, in accordance with an aspect of the present disclosure.

FIG. 8 is a partial side perspective view of an embodiment of the test system 52. The attachment feature 100 of the illustrated test system 52 may be removably coupled to the body 68. By way of example, holes 240 may be formed through the attachment feature 100. The holes 240 may align with additional holes formed through the body 68 (e.g., at the fourth side 168 of the body 68). Respective fasteners may be inserted through the aligned holes to extend through the attachment feature 100 and the body 68, and the fasteners may compress or bias the attachment feature 100 and the body 68 against one another to secure the attachment feature 100 to the body 68. The fasteners may also be removed to enable the attachment feature 100 to be decoupled from the body 68.

The test system 52 may further include an additional attachment feature 242, which is disposed at a fifth side 244 of the body 68 in the illustrated embodiment. The additional attachment feature 242 may enable the test system 52 to be mounted or coupled to another object, such as an edge of a panel. For instance, the additional attachment feature 242 may include a hook that forms a gap 246. The edge may be inserted into the gap 246 to enable the additional attachment feature 242 to be placed atop the object, and the object may support the test system 52.

FIG. 9 is a partial side perspective view of an embodiment of the test system 52. The device holder 97 of the illustrated test system 52 may be removably coupled to the body 68. For example, holes 260 may be formed through the device holder 97 (e.g., the flange 166 of the device holder 97). The holes 260 may align with corresponding holes formed through the body 68 (e.g., at the third side 156 of the body 68). Respective fasteners may be inserted through the aligned holes to extend through the device holder 97 and the body 68, and the fasteners may compress or bias the device holder 97 and the body 68 against one another to secure the device holder 97 to the body 68. The fasteners may also be removed to enable the device holder 97 to be decoupled from the body 68. In certain embodiments, each of the holes 240 and the holes 260 may individually align with either set of holes formed at the third side 156 or the fourth side 168 of the body 68. That is, the holes 240 may enable the attachment feature 100 to individually couple to either the third side 156 or the fourth side 168 of the body 68 one at a time, and the holes 260 may enable the device holder 97 to individually couple to either the third side 156 or the fourth side 168 of the body 68 one at a time. Indeed, the user may easily adjust the positioning of the attachment feature 100 and the device holder 97 relative to the body 68 as desired by coupling the fasteners to and decoupling the fasteners from the holes 240, 260.

Slots or openings 262 may be formed through the base 160 of the device holder 97, and a respective backing 162 may be inserted into the slots 262. The backings 162 may be movable within the respective slots 262 in order to adjust a size of the space 164 defined by the backings 162. As an example, the backings 162 may translate along the base 160 in a first direction 264 via the slot 262 to increase a size of the space 164. For instance, the backings 162 may be moved in the first direction 264 to facilitate positioning of the test device 62 within the space 164 or to facilitate removal of the test device 62 from the space 164. The backings 162 may also translate along the support in a second direction 266, opposite the first direction 264, via the slot 262 to reduce the size of the space 164. For example, the backings 162 may be moved in the second direction 266 to secure the test device 62 within the space 164. Indeed, the backings 162 may be moved to abut the test device 62 and to impart a force that biases the test device 62 against the flange 166, thereby restricting movement of the test device 62 within the space 164. The backings 162 may also be locked into a desired position along the slots 262. In some embodiments, each backing 162 may include a hole 268 and a recess 270 that enables access to the hole 268. A fastener may be inserted through the hole 268 and may bias the backing 162 against the base 160 to restrict movement between the backing 162 and the base 160, thereby locking the position of the backing 162 along the slot 262. The fastener may be removed or loosened to enable the backing 162 to be adjusted along the slot 262 (e.g., moved along the first direction 264 or the second direction 266).

Another suitable component may additionally or alternatively be used to secure the test device 62 within the space 164. As an example, additional slots 272 may be formed through the base 160, and a strap may be inserted through the additional slots 272. The strap may be tightened against the test device 62 to secure the test device 62 within the space 164 or loosened to enable the test device 62 to move within the space 164. As another example, a magnet may be used to magnetically engage with the test device 62 to retain the test device 62 within the space 164. Further, in embodiments in which the test device 62 may merely include the conductors 64, 66, a different device holder 97 may be used to secure the conductors 64, 66 onto the base 160. For instance, the device holder 97 may include features around which the conductors 64, 66 may be coiled or wrapped to be secured to the test system 52.

In the illustrated embodiment, the test system 52 is mounted to a panel 274 (e.g., of the electrical system 50) via the additional attachment features 242. For example, the panel 274 may be inserted into the gap 246 and may abut against the additional attachment features 242 (e.g., via gravitational force). The additional attachment features 242 may be shaped so as to capture the panel 274, thereby blocking relative movement between the test system 52 and the panel 274 to secure the test system 52 onto the panel 274. Further, the test system 52 may be detached from the panel 274 (e.g., via a force applied against gravitational force), such as to held by the user or repositioned for support by another component. As such, the additional attachment features 242 may facilitate desirable positioning of the test system 52.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present disclosure should, therefore, be determined only by the following claims.

Indeed, the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A test system for an electrical system, the test system comprising:
   a slot array comprising a plurality of slots and a plurality of recesses formed therethrough;
   a plurality of mounts, wherein each mount of the plurality of mounts is positioned within a respective recess of the plurality of recesses to align with a respective slot of the plurality of slots;
   a connector port comprising a plurality of pins; and
   a plurality of conductors, wherein each conductor of the plurality of conductors extends from a respective pin of the plurality of pins to a respective mount of the plurality of mounts;
   wherein each mount of the plurality of mounts is configured to receive an additional conductor via a corresponding slot of the plurality of slots to electrically couple the additional conductor to a corresponding pin of the plurality of pins via a corresponding conductor of the plurality of conductors;
   wherein a mount of the plurality of mounts comprises a first receptacle and a second receptacle, the first receptacle is configured to receive the corresponding conductor of the plurality of conductors, and the second receptacle is configured to receive the additional conductor via the corresponding slot.

2. The test system of claim 1, comprising a plate and a backing coupled to the plate, wherein the backing defines a space configured to receive a test device comprising the additional conductor.

3. The test system of claim 2, wherein the backing is adjustable along the plate to change a size of the space.

4. The test system of claim 3, wherein the plate comprises an opening, the backing is inserted through the opening, and the backing is translatable along the plate via the opening.

5. The test system of claim 1, wherein the connector port comprises a male military connector port.

6. The test system of claim 1, wherein the mount comprises a throat adjacent to the first receptacle and a passage adjacent to the second receptacle, the throat and the passage cooperatively span between the first receptacle and the second receptacle to enable the additional conductor to extend from the second receptacle toward the first receptacle to electrically couple the additional conductor to the corresponding conductor and the corresponding pin of the plurality of pins, and the throat comprises a first cross-sectional area that is smaller than a second cross-sectional area of the first receptacle and a third cross-sectional area of the passage.

7. The test system of claim 1, wherein a mount of the plurality of mounts is configured to receive a wire connector secured onto a conductor of the plurality of conductors to retain the conductor within the mount via the wire connector.

8. A test system for an electrical system, the test system comprising:
   a body comprising an enclosure defining an internal volume, wherein the body comprises a slot array comprising a plurality of slots and a plurality of recesses formed therethrough, and each slot of the plurality of slots is aligned with a corresponding recess of the plurality of recesses;
   a mount disposed within the internal volume,
      wherein the mount is positioned within a recess of the plurality of recesses; and,
      wherein the mount is aligned with a slot and is configured to receive an additional conductor inserted through the slot;
   a connector port comprising a plurality of pins;
   a conductor extending within the internal volume, wherein the conductor is electrically coupled to a pin of the plurality of pins and is inserted into the mount;
   a device holder removably coupled to the body via a fastener configured to extend through the device holder and the body, wherein the device holder defines a space configured to receive a test device for testing an electrical connection of the electrical system.

9. The test system of claim 8, comprising a power source and an output component that are each electrically connected to the conductor, wherein the power source is configured to provide power to the output component based on an electrical connection between the pin of the plurality of pins and a portion of the electrical system via the additional conductor inserted through the slot.

10. The test system of claim 9, wherein the output component is configured to emit a light, output a sound, or both, in response to receiving the power from the power source.

11. The test system of claim 8, comprising a handle configured to removably couple to the body via a fastener configured to extend through the handle and the body.

12. A test system for an electrical system, the test system comprising:
   a body comprising a slot array, wherein the slot array comprises a plurality of slots and a plurality of recesses;
   a plurality of mounts,
      wherein a mount of the plurality of mounts is positioned within a respective recess of the plurality of recesses to align with a respective slot of the plurality of slots; and
   a connector port comprising a plurality of pins;
   a plurality of conductors, wherein a conductor of the plurality of conductors is electrically coupled to a respective pin of the plurality of pins and extends into the mount of the plurality of mounts; and a device holder comprising
- a base configured to couple to the body, wherein the device holder defines a space configured to receive a test device for testing an electrical connection of the electrical system and;
- a backing adjustably coupled to the base, wherein the backing is configured to move relative to the base to adjust a size of the space defined by the device holder;

wherein the mount of the plurality of mounts is configured to receive an additional conductor of the test device via a corresponding slot of the plurality of slots to electrically couple the additional conductor to a corresponding pin of the plurality of pins via the conductor of the plurality of conductors.

13. The test system of claim 12, wherein the connector port is configured to receive a cable to electrically couple the plurality of pins to an additional plurality of pins of the electrical system.

14. The test system of claim 12, wherein the body comprises a first plurality of holes formed at a first side of the body and a second plurality of holes formed at a second side of the body, the base of the device holder comprises a third plurality of holes, the test system comprises a handle comprising a fourth plurality of holes, the third plurality of holes is configured to individually align with each of the first plurality of holes and the second plurality of holes to enable the base to individually couple to each of the first side and the second side of the body, and the fourth plurality of holes is configured to individually align with each of the first plurality of holes and the second plurality of holes to enable the handle to individually couple to each of the first side and the second side of the body.

* * * * *